(12) United States Patent
Roberts et al.

(10) Patent No.: US 8,933,742 B2
(45) Date of Patent: Jan. 13, 2015

(54) METHODS AND DEVICES RELATING TO TIME-VARIABLE SIGNAL PROCESSING

(71) Applicant: The Royal Institution for the Advancement of Learning/McGill University, Montreal (CA)

(72) Inventors: Gordon Roberts, Montreal (CA); Mohammad Ali Bakhshian, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 0 days.

(21) Appl. No.: 13/890,649

(22) Filed: May 9, 2013

(65) Prior Publication Data
US 2013/0300483 A1 Nov. 14, 2013

Related U.S. Application Data

(60) Provisional application No. 61/644,468, filed on May 9, 2012.

(51) Int. Cl.
*H03H 11/26* (2006.01)
*H03K 3/86* (2006.01)
*H03K 5/13* (2014.01)
*H03K 5/00* (2006.01)

(52) U.S. Cl.
CPC .. *H03K 3/86* (2013.01); *H03K 5/13* (2013.01); *H03K 2005/00032* (2013.01); *H03K 2005/00052* (2013.01)
USPC .......................................... 327/268; 327/261

(58) Field of Classification Search
USPC ................................................ 327/261, 268
See application file for complete search history.

(56) References Cited

U.S. PATENT DOCUMENTS

| | | | | |
|---|---|---|---|---|
| 4,464,587 A * | 8/1984 | Suzuki et al. | ................. | 327/206 |
| 5,216,289 A * | 6/1993 | Hahn et al. | .................... | 327/108 |
| 6,018,264 A * | 1/2000 | Jin | ................ | 327/536 |
| 6,191,630 B1 * | 2/2001 | Ozawa et al. | ................. | 327/278 |
| 6,329,867 B1 * | 12/2001 | Penney et al. | ................. | 327/392 |
| 2003/0076149 A1 * | 4/2003 | Haga | ............................ | 327/333 |
| 2003/0234674 A1 * | 12/2003 | Morgan | ....................... | 327/290 |
| 2011/0254603 A1 * | 10/2011 | Kamath et al. | ................ | 327/158 |
| 2012/0286840 A1 * | 11/2012 | Wei et al. | ...................... | 327/284 |

* cited by examiner

*Primary Examiner* — Ryan Jager
(74) *Attorney, Agent, or Firm* — The Law Office of Michael E. Kondoudis

(57) ABSTRACT

Time-Mode Signal Processing (TMSP) offers a means for offsetting some of the challenges for analog circuit designs when exploiting CMOS circuit processes designed for digital applications. It would therefore be beneficial to provide a digital method for the storage, addition and subtraction of Time-Mode variables as these offer significant benefit to providing TMSP techniques and expanding their exploitation within devices, systems, and applications. While driven by CMOS process challenges the TM circuits outlined may exploit essentially any digital circuit technology since they are based upon delay. The inventors present an approach to TM variables wherein a switched delay unit is exploited and adopted such that the instantaneous phase difference between two rising signal edges can be latched and used to perform various arithmetic operations. Beneficially, the technique allows analog sampled-data signal processing to be implemented within digital circuitry.

19 Claims, 10 Drawing Sheets

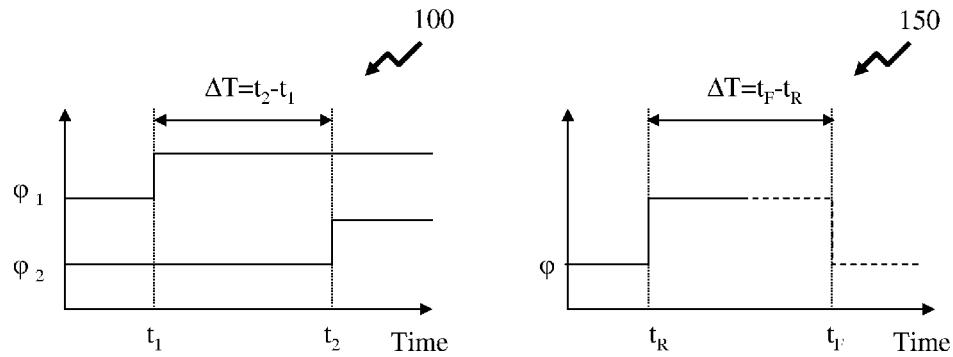
Figure 1A
Figure 1B
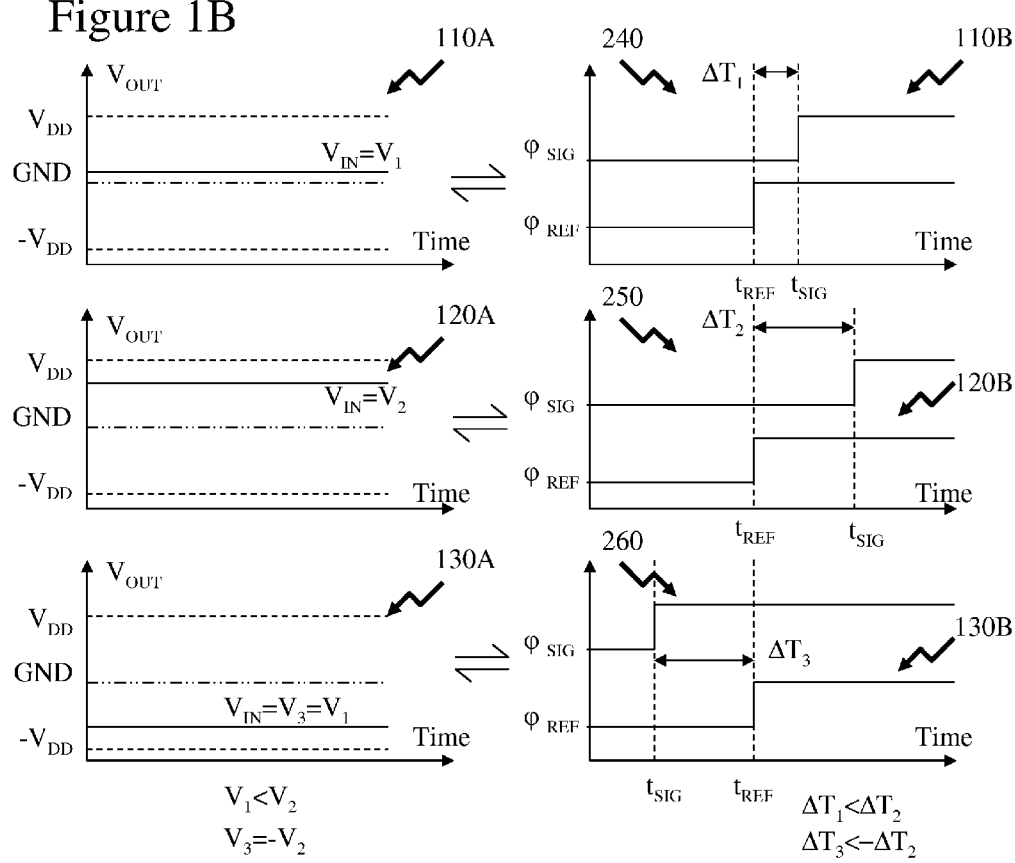

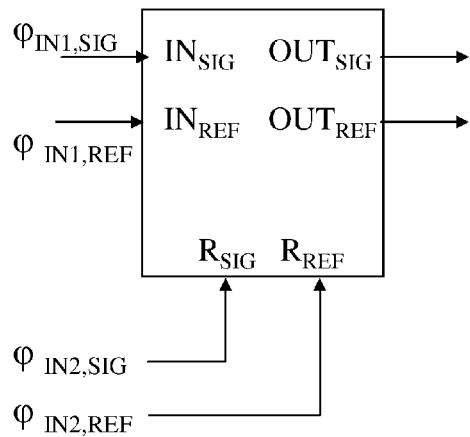
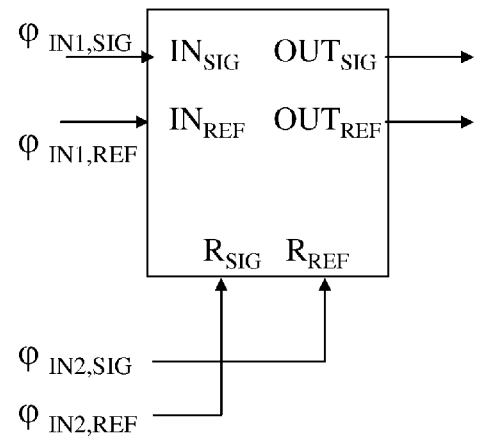
Figure 7A    Figure 7B
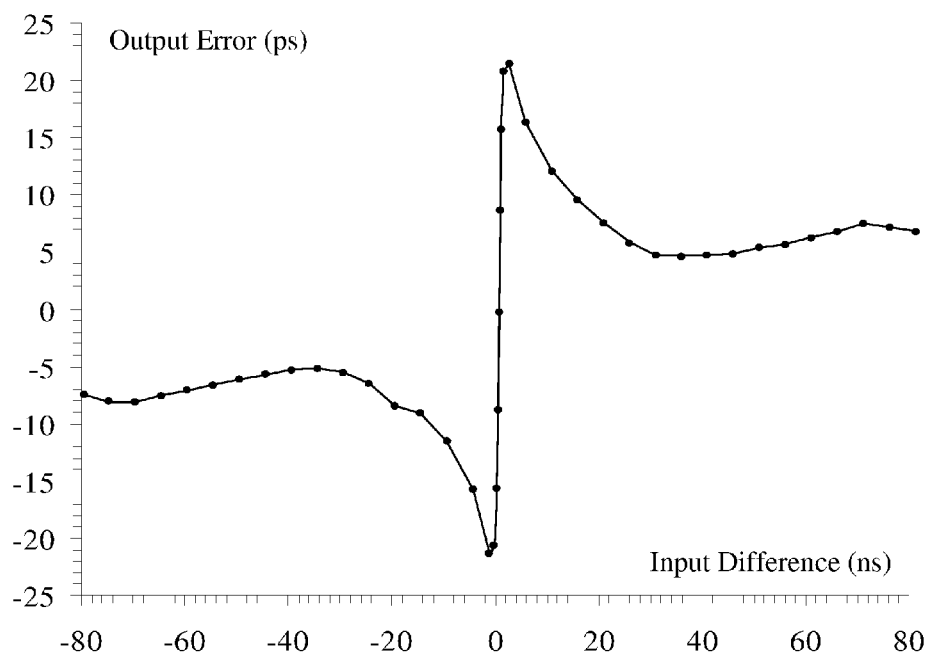
Figure 8

METHODS AND DEVICES RELATING TO TIME-VARIABLE SIGNAL PROCESSING

CROSS-REFERENCE TO RELATED APPLICATIONS

This patent application claims the benefit of U.S. Provisional Patent Application U.S. 61/644,468 filed May 9, 2012 entitled "Digital Storage, Addition and Subtraction of Time-Mode Variables", the entire contents of which are included by reference.

FIELD OF THE INVENTION

This invention relates to time-mode signal processing and more particularly to digital methods of storing and processing time-mode variables.

BACKGROUND OF THE INVENTION

During the past decade, the feature size dimensions for CMOS technologies have been continuously reduced to improve digital integration, reduce power consumption, and increase speed. In 1998 the standard CMOS process was a 180 nm process, by 2004 this had been reduced to 90 nm, to 45 nm in 2008, and 22 nm in 2012. Projecting forward it is anticipated that 10 nm processes will be available in 2016 and then 5 nm in 2020 according to the International Technology Roadmap for Semiconductors (see http://www.itrs.net/). At the same time silicon wafers have increased in diameter from 150 mm (6"), to 200 mm (8"), and by 2012 a state-of-the-art semiconductor fabrication plant would be considered as one using 300 mm (12") wafers and today prototype (research) fabrication plants are establishing 450 mm (18") wafer processes. However, these advancements whilst overcoming major technological hurdles in photolithography, etching, deposition, clean room quality, automated wafer handling, etc have been primarily focused to digital electronics as exemplified perhaps by microprocessors and digital memory. Today Intel's Sandy Bridge EP-8 8-core microprocessor occupies 435 $mm^2$ and comprises 2.27 billion transistors on 22 nm linewidth clocking at 3 GHz. Similarly, today NAND flash memory devices are available based upon 20 nm processes with capacities of 16 GB and 32 GB with some manufacturers now producing on processes approaching 10 nm.

However, these achievements are not mirrored within analog circuits where these achievements of reduced device dimensions, reduced linewidths, increased digital switching speeds, material specifications, etc have caused several challenges for the analog designer, impacted performance, and reduced reproducibility of manufactured analog circuits. Such challenges include, but are not limited to, non-optimal operating points, current leakage, reduced input voltage swing, crosstalk of digital switching into analog circuit paths, and reduced linearity. Addressing these challenges via mitigating design solutions, increased control and reference circuit requirements, etc have resulted in increased use of silicon and power in order to achieve the desired performance and limited development of reconfigurable analog circuits. These adaptations for analog circuits are in many instances hampered by the lack of proper analog models as whilst our world is analog in nature the focus of CMOS electronics has been digital and digitizing the analog signal as soon as possible within the silicon circuit at rates and number of bits commensurate with the control/decision/rendering processes etc. Amongst the solution considered for addressing these issues Time-Mode Signal Processing (TMSP, also referred to as Time-Domain Signal Processing) offers a means of offsetting some of these challenges and as a result already enjoys commercial deployment in a variety of applications such as Positron Emission Topography (PTE) imaging in nuclear science, Digital Phase-Locked Loops (DPLL) in RF transmitters, and time-to-digital converters (TDC) in instrumentation, such as the Digital Storage Oscilloscope (DSO), see for example Roberts et al in "A Brief Introduction to Time-to-Digital and Digital-to-Time Converters" (IEEE Transaction on Circuits and Systems II: Express Briefs, Vol. 57, pp. 153-157).

TMSP provides a means to implement analog signal processing functions essentially in any circuit technology by exploiting one of the most basic circuit functions or elements available, namely delay. TMSP may therefore be considered, or defined, as the detection, storage, and manipulation of sampled analog information using time-difference variables. Accordingly, instead of normal circuit parameters of voltage and current TMSP uses time as the effective variable for all the computations. Accordingly, TMSP as with other signal processing techniques in manipulating the effective computational variable must be able to establish the result of addition (summation) and subtraction (difference) of two time-mode (TM) variables.

However, because time is not a physical quantity, the summation and subtraction of two time-mode (TM) variables cannot be undertaken without first transforming them into an intermediate physical quantity. Within the prior art one such approach exploited voltage as the intermediate physical quantity, see for example Ravinuthula et al in "Time-Based Arithmetic using Step Functions" (IEEE Int. Symp. Circuits and Systems, 2004, Vol. 1, pp. 305-308). Accordingly such TMSP circuits exploiting this transformation necessitate the adoption of analog components for signal processing thus forfeiting the digital advantages of today's advanced CMOS semiconductor processing and circuits for TMSP. More recently, an attempt to circumvent this problem was presented by Ying et al in "A 1.7 mW 11b 1-1-1 MASH $\Delta\Sigma$ Time to-Digital Converter" (IEEE Int. Solid-Slate Circuits Conference, 2011, Technical Digest, pp. 420-482) claiming a digital technique for time summation. However, as the technique is limited to the addition of a single TM variable to the phase of a running oscillator it cannot be considered a general method to addressing the requirements of summation, subtraction, etc within TMSP.

Accordingly it would be evident that a digital method to the storage, addition and subtraction of TM variables has significant benefit to providing TMSP techniques and expanding their exploitation within devices, systems, and applications. Beneficially such TMSP approaches may then exploit today's high volume, large wafer, small dimension, and high speed CMOS digital electronics. Further, the basic concepts may be transferred to essentially any digital circuit technology as they exploit delay. Accordingly, the inventors present an approach to TM variables wherein a switched delay unit is exploited and adopted such that the instantaneous phase difference between two rising signal edges can be latched and used to perform various arithmetic operations. Beneficially, the technique allows analog sampled-data signal processing to be implemented within digital circuitry.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate drawbacks within the prior art relating to time-mode signal processing and more particularly to digital methods of storing and processing time-mode variables.

In accordance with an embodiment of the invention there is provided a time-mode device comprising a switchable delay unit comprising:
- a first input port for receiving a signal comprising at least a first rising edge;
- a second input port for receiving a switch signal comprising at least a first falling edge and a second rising edge;
- a first circuit portion for receiving the signal and charging a capacitor from a predetermined supply voltage when the signal is low and discharging the capacitor when the signal is high;
- a second circuit portion for selectively coupling the capacitor to ground to enable its discharge when the switch signal is high and disable the discharge when the signal is high;
- an inverter circuit coupled to the capacitor, the inverter having a predetermined threshold voltage;
- wherein receipt of the second rising edge by the second circuit portion results in the voltage on the capacitor dropping below the predetermined threshold such that the inverter generates an output rising edge having a time delay with respect to the first rising edge.

In accordance with an embodiment of the invention there is provided a time-mode device comprising:
first and second switchable delay units, each switchable delay unit comprising:
- first and second input ports, each input port for receiving a signal comprising at least a rising edge and a falling edge;
- a first circuit portion for charging a capacitor from a predetermined supply voltage when the signals on the first and second input ports have first predetermined level combination and discharging the capacitor when the signals on the first and second input ports have second predetermined level combination; and
a second circuit portion for selectively coupling and decoupling the capacitor to ground to enable and disable respectively its discharge when at least the signal on the first input port is high and when at least the signal on the second input port is high respectively.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 1A depicts schematics of time-difference signal representations using two-signals and one-signal;

FIG. 1B depicts schematics for voltage-mode and time-mode representations showing one-to-one correspondence between voltage/current signals and time variables;

FIGS. 7A and 7B depict adoption of the Time Latch according to an embodiment of the invention for the performance of summation and subtraction mathematical processes respectively;

FIG. 8 depicts the simulated error between the input and the latched Time-Mode value for a Time Latch according to an embodiment of the invention.

DETAILED DESCRIPTION

Figure 2A:
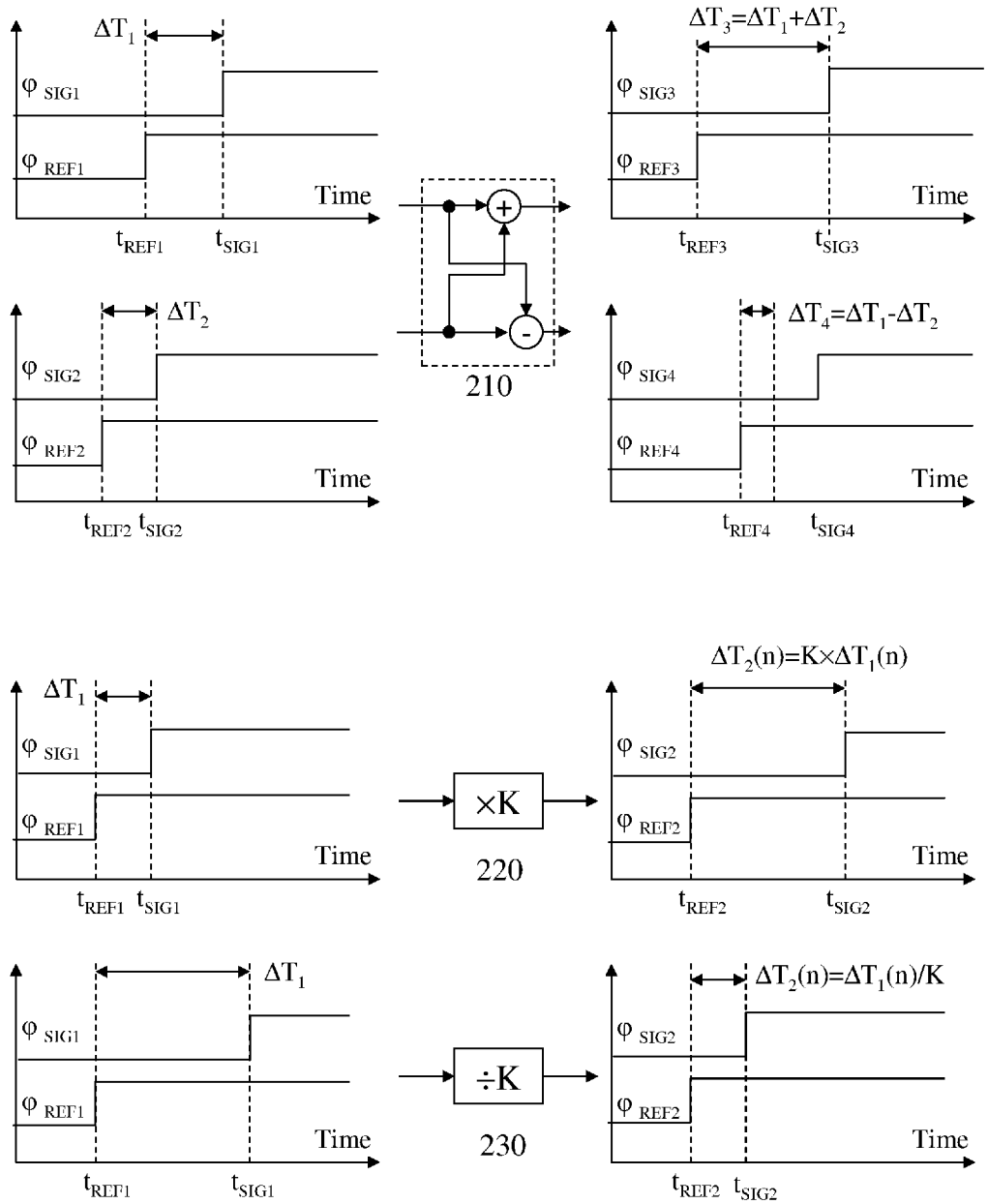
FIG. 2A depicts addition, subtraction, multiplication and division operations using time-domain signals.

The present invention is directed to time-mode signal processing and more particularly to digital methods of storing and processing time-mode variables.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing a exemplary embodiment. It being understood that various changes may be made in the function and arrangement of elements without departing from the spirit and scope as set forth in the appended claims.

As noted supra a digital method for the storage, addition and subtraction of TM variables offers significant benefit in allowing TMSP techniques to be expanded/exploited within a variety of devices, systems, and applications. According to embodiments of the invention described below in respect of FIG. 2 through 8 digital circuits that perform storage, addition and subtraction of TM variables. These circuits are, to the inventor's knowledge, the first such storage mechanism for TM variables that has been proposed and are expected to be useful for general purpose TM signal processing. Beneficially such TMSP approaches may then exploit today's high volume, large wafer, small dimension, and high speed CMOS digital electronics. Further, the basic concepts may be transferred to essentially any digital circuit technology as they exploit delay. Accordingly, the inventors present switched delay units such that the instantaneous phase difference between two rising signal edges can be latched and used to perform various arithmetic operations. Beneficially, the technique allows analog sampled-data signal processing to be implemented within digital circuitry.

Referring to FIG. 1A there are depicted first and second schematics 100 and 150 depicting two-signal and one-signal representations of a time-difference variable, $\Delta T$, which is defined as the quantity of time between an event occurring with respect to either a reference time or another event. Referring to first schematic 100 the time-difference variable is depicted as the time interval (or phase difference) between the rising edges of two step-like digital circuits, $\phi_1$ and $\phi_2$, such that $\Delta T = t_2 - t_1$. In second schematic 150 the time-difference variable is defined as the time interval between the rising and falling edges of a step-like digital circuit, i.e. the duration of the pulse, such that $\Delta T = t_F - t_R$. It would be evident that single signal approach is signal-self referenced.

Now referring to FIG. 1B first to third schematics 110A, 120A, and 130A respectively depict voltage mode representations of voltages three voltage $V_1$, $V_2$, and $V_3$ together with resulting decisions that $V_1 < V_2$ and $V_3 = -V_2$. In fourth to sixth schematics 110B, 120B, and 130B respectively depict corresponding time mode representations of first to third schematics 110A, 120A, and 130A respectively to denote the one-to-one correspondence between voltage/current signals and time mode variable. Accordingly, three TM values $\Delta T_1$, $\Delta T_2$, and $\Delta T_3$ for the TM variable delay are depicted based upon two-signal representations together with the corresponding resulting decisions that $\Delta T_1 < \Delta T_2$ and $\Delta T_3 = -\Delta T_2$. It would be evident that similar representations may be generated using two-signal representations based upon phase of the signals rather than the timing of step-like digital transitions.

Figure 2B:
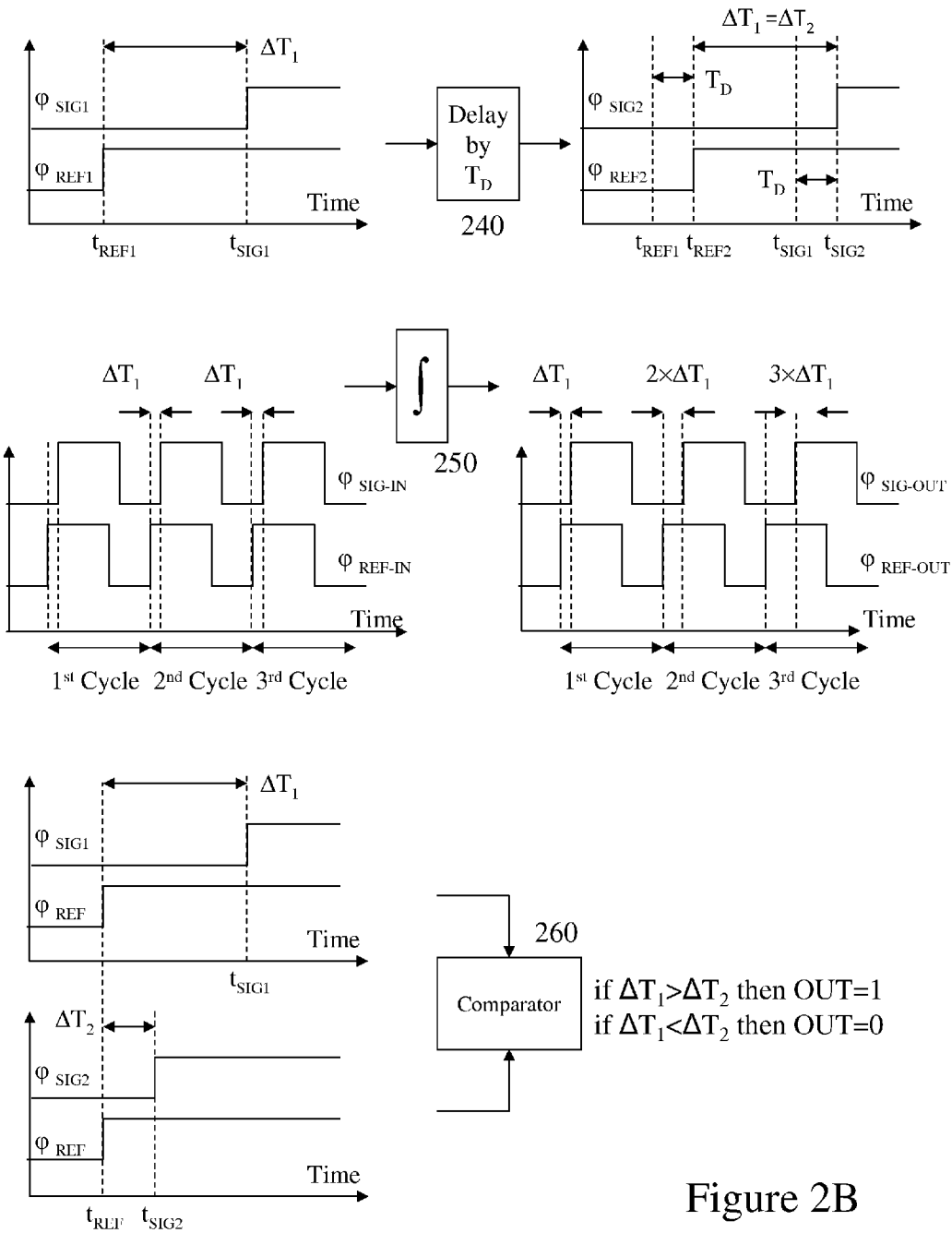
FIG. 2B depicts delay, integration, and decision making operations using time-domain signals.

Now referring to FIG. 2A the addition and subtraction of two time domain values of a TM variable using two-signal representations are depicted. Accordingly the two TM values $\Delta T_1$, $\Delta T_2$ are depicted on the left hand side of first functional schematic 210 are added or subtracted as depicted on the right hand side of first functional schematic 210 such that $\Delta T_3 = \Delta T_1 + \Delta T_2$ or $\Delta T_4 = \Delta T_1 - \Delta T_2$. Referring to FIG. 2B the multiplication and division of a time domain value for a TM variable using two-signal representations are depicted such that initial TM variable values are represented to the left of second and third functional schematics 220 and 230 in respect of multiplication and division respectively. To the right of second and third functional schematics 220 and 230 the TM variable result values of these processes, $\Delta T_2(n) = K \times \Delta T_1(n)$ and $\Delta T_2(n) = \Delta T_1(n)/K$, are shown wherein the factor K represents the multiplication/division applied to the original TM variable value $\Delta T_1$.

Figure 2C:
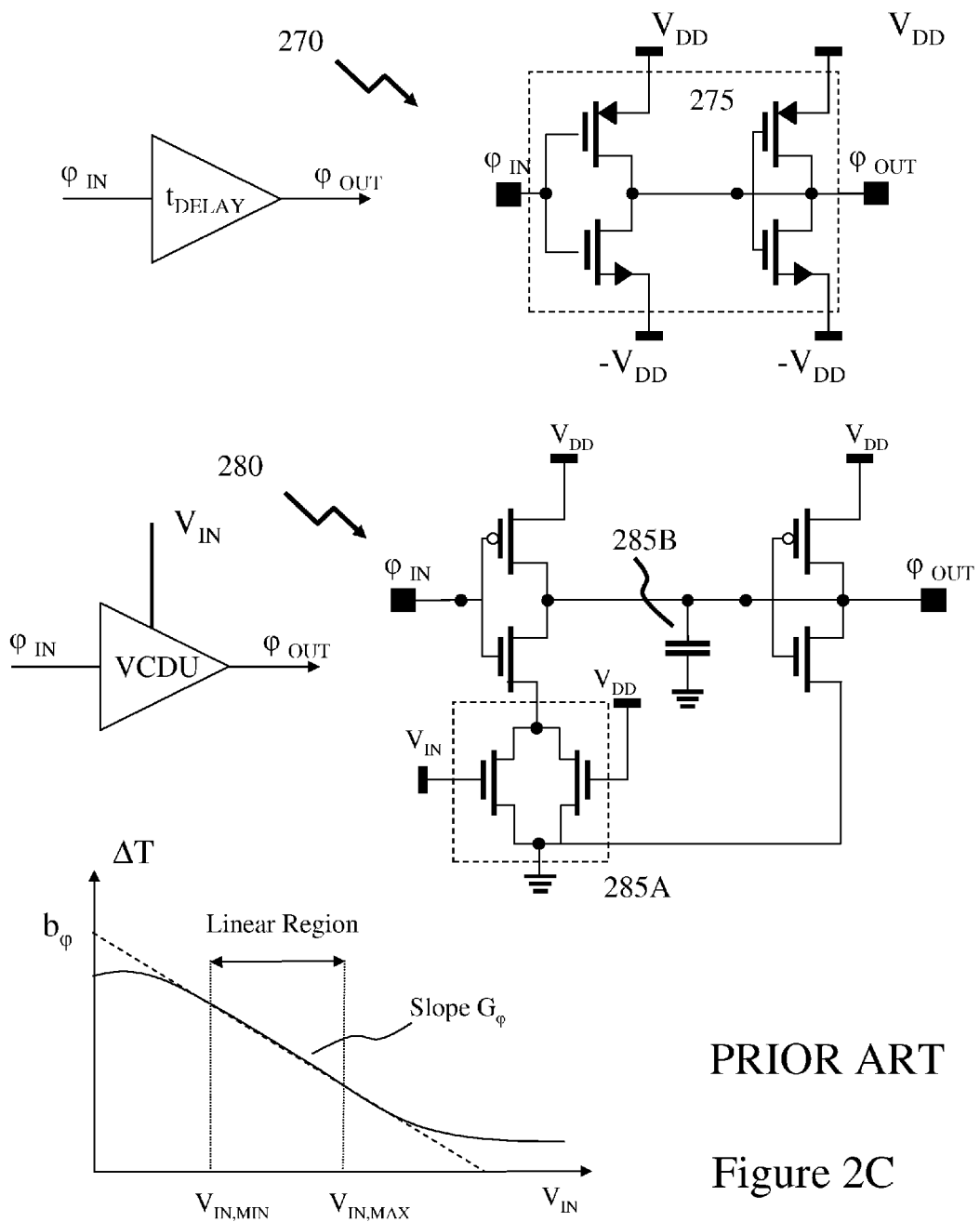
FIG. 2C depicts a prior art fixed delay circuit and a voltage controlled delay unit according to an embodiment of the invention.

Next referring to FIG. 2C through 2E are schematics for processes of delay, integration, and decision making as applied to a TM variable value respectively. Each schematic depicts to the left of first to third functional schematics 240 to 260 respectively are initial TM variable values represented using two-signal representations whilst to the right are the results of these processes upon the TM variable value. Accordingly it would be evident in respect of delay 240 that each of the reference and signal, wherein the signal is at an initial delay $\Delta T_1 = t_{SIG1} - t_{REF1}$, where $t_{SIG1}$ and $t_{REF1}$ represent the rising edge times of the reference and signal respectively, are each delayed by the same offset $T_D$ such that the TM variable value is unchanged. In respect of integration a series of events, i.e. rising edges, for the reference and signals $\phi_{REF-IN}$ and $\phi_{SIG-IN}$ respectively are depicted wherein there is a constant TM variable value $\Delta T_1$ between them. As processed by integrator 250 it can be seen that the resulting output signal $\phi_{SIG-OUT}$ has its rising edges offset with respect to the unaffected reference $\phi_{REF-OUT}$ by TM variable values of $\Delta T_1$, $2 \times \Delta T_1$, $3 \times \Delta T_1$ respectively. It would be evident that where the TM variable values offsets between sequential event pairs, namely reference and signal rising edges, were different then these would be similarly be integrated.

Finally, as denoted with third functional schematic 260 with the comparator operation then to the left of the third functional schematic 260 are depicted two-signal representations of first and second TM variable values $\Delta T_1$ and $\Delta T_2$ respectively with the comparator results to the right of the Comparator 260. Accordingly, if $\Delta T_1 > \Delta T_2$ then OUT=1 and if $\Delta T_1 < \Delta T_2$ then OUT=0. It would be evident, therefore, that a delay element is an essential element to TMSP. Within the prior art delay has been implemented within CMOS circuits using inverters such as depicted in first schematic 270 in FIG. 2C wherein inverter pairs 275 are cascaded in series, each inverter pair 275 having a constant predetermined delay. Accordingly, such delay is employed within the prior art primarily to balance path delays within high speed circuits.

It would be evident that such prior art time delay circuits cannot provide the required functionality within TMSP circuits as the time delay must be variable and determined in dependence upon the desired operation, e.g. summation, subtraction, etc., and the value(s) of the TM variable(s). Referring to second schematic 280 in FIG. 2C there is depicted a Voltage Controlled Delay Unit (VCDU) according to an embodiment of the invention wherein the addition of input stage 285 between power rail $V_{DD}$ and control voltage $V_{IN}$ to first inverter and capacitor 285B between inverters results in negative gain current starved operation of the inverter pair such that time delay is a function of control voltage $V_{IN}$. Whilst essentially non-linear based upon the specifications of an implementation a limited range of linear operation defined by the large signal transfer characteristic will exist between minimum and maximum control voltages $V_{IN,MIN}$ and $V_{IN,MAX}$ respectively. For example, based upon computer simulations exploiting the 0.18 µm TSMC CMOS process with 1.8V power supply a variable delay with slope $G_\phi = -320$ ps/V is obtained with a linear input control range $0.8 < V_{IN} \leq 1.2$, maximum delay 890 ps at 1.1 GHz. Linearity error was established as ±0.15% over this control range with power consumption 136 µW.

The VCDU of FIG. 2C achieves a maximum delay variation of $320 \times 0.4 = 128$ ps such that even achieving 1 ns delay variation requires 8 VCDU circuits be cascaded and achieving 84 ns would require over 650 such VCDU circuits be combined. The significance of 84 ns will become evident subsequently, but it is clear that such a VCDU cascade is counter to the original stated advantages of TMSP in terms of speed, footprint, power etc. Accordingly, the inventors have established a novel Switched Voltage Controlled Delay Unit to address this issue as discussed below in respect of FIG. 3A through 8.

Figure 3A:
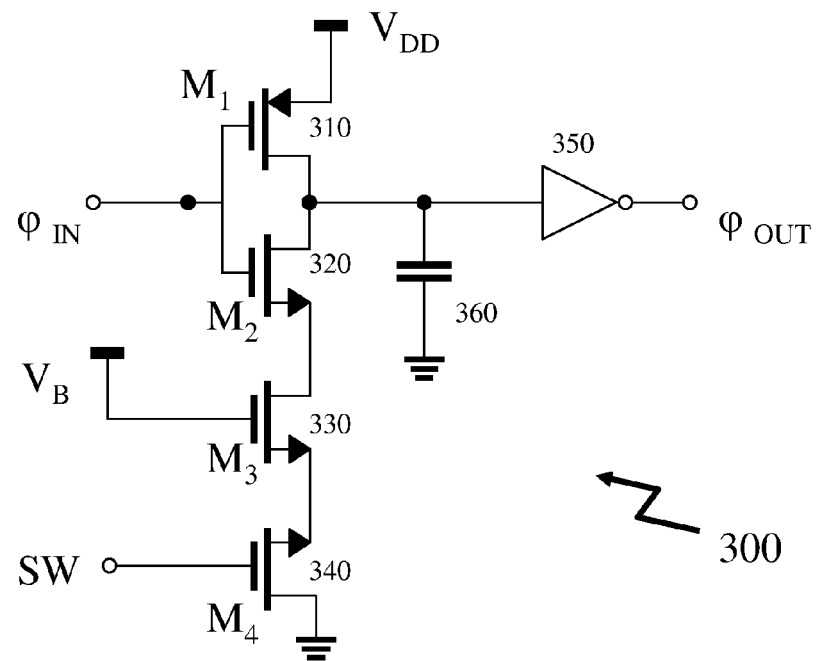
FIG. 3A depicts a schematic circuit for a Switched Delay Unit according to an embodiment of the invention.
Figure 3B:
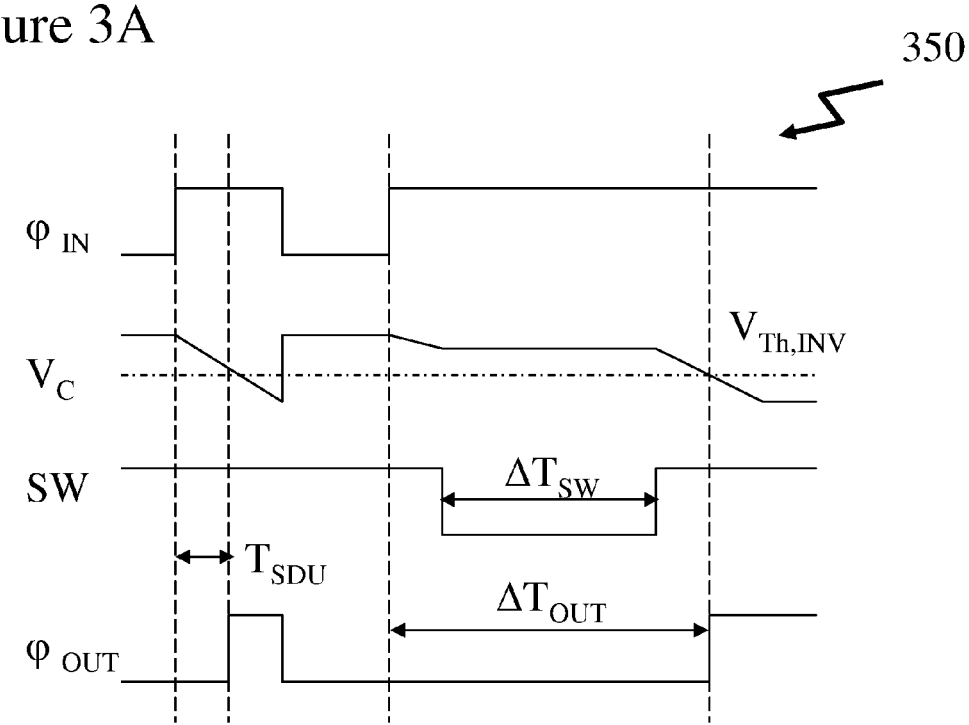
FIG. 3B depicts the operational signals of the Switched Delay Unit according to an embodiment of the invention described in FIG. 3A.

Switched Delay Unit:

Referring to FIG. 3A the circuit schematic 300 for a switched delay unit (SDU) according to an embodiment of the invention is depicted. Capacitor 360 is charged to $V_{DD}$ when the input $\phi_{IN}$ is low. Upon arrival of a rising edge at $\phi_{IN}$ and provided SW="1", the voltage across Capacitor 360 begins to discharge through transistors $M_2$ 320 to $M_4$ 340 to trigger the output inverter 350, which is depicted simply as schematic rather than actual transistor elements. The delay between the rising edges at $\phi_{IN}$ and $\phi_{OUT}$, denoted as $T_{SDU}$, is fixed and governed by the values of Capacitor 360 and $V_B$. However, by switching M4 340 off before the inverter is triggered, the discharge procedure stops and the residual charge stored within the Capacitor 360. As shown in FIG. 3B with timing chart 350 the time difference between the output and the input is extended by the length of this interruption, i.e. as determined by Equation (1). Accordingly, the SDU provides for switched delay based upon the control signal SW and thereby programmable time delay based upon variable triggering through control signal SW.

$$\Delta T_{OUT} = T_{SDU} + \Delta T_{SW} \quad (1)$$

Figure 3C:
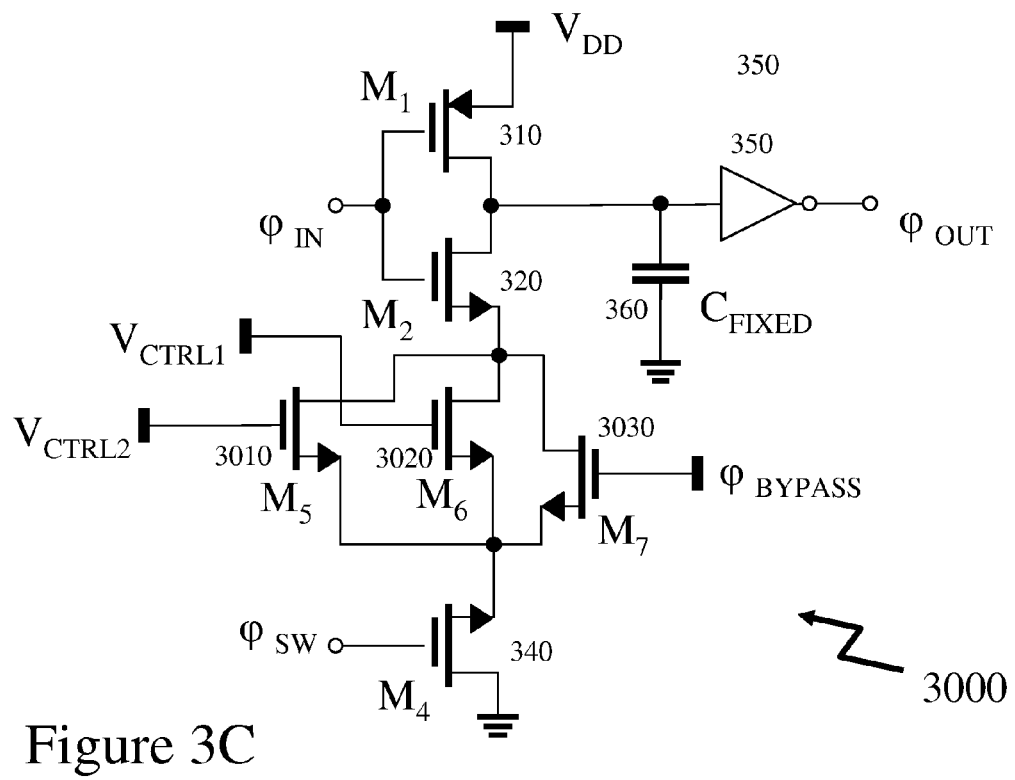
FIG. 3C depicts a schematic circuit for a Switched Delay Unit according to an embodiment of the invention.
Figure 3D:
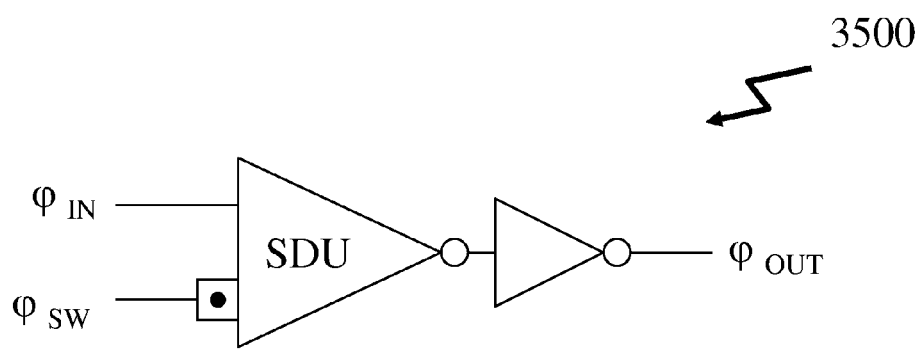
FIG. 3D depicts a circuit schematic employed within this specification for a Switched Delay Unit according to an embodiment of the invention.

Referring to FIG. 3C there is depicted a circuit schematic 3000 of a SDU according to an embodiment of the invention. As with circuit schematic 300 the capacitor 360 is charged to $V_{DD}$ when the input $\phi_{IN}$ is low and begins to discharge upon arrival of a rising edge at $\phi_{IN}$ provided SW="1." This discharge being via $M_2$ 320, $M_5$ to $M_7$ 3010 to 3030 respectively and $M_4$ 340. However, rather than the delay between the rising edges at $\phi_{IN}$ and $\phi_{OUT}$, denoted as $T_{SDU}$, being fixed and governed by the values of Capacitor 360 and $V_B$ as discussed supra in respect of FIG. 3A, transistor $M_3$ 330 has been replaced by $M_5$ to M, 3010 to 3030 respectively and these are each coupled to $V_{CTRL2}$, $V_{CTRL1}$, and $\phi_{BYPASS}$ respectively. Accordingly, the SDU depicted in FIG. 3C may not provide control of the "fixed" component of $\Delta T_{OUT}$ as well as providing the variable switched delay $\Delta T_{SW}$. A generalized circuit symbol for an SDU employed below in respect of FIG. 4 through 8 is depicted by symbol 3500 in FIG. 3D in combination with an inverter symbol. Optionally, the $V_{CTRL1}$, $V_{CTRL2}$, and $\phi_{BYPASS}$ may be denoted as control signals to the SDU.

Figure 4:
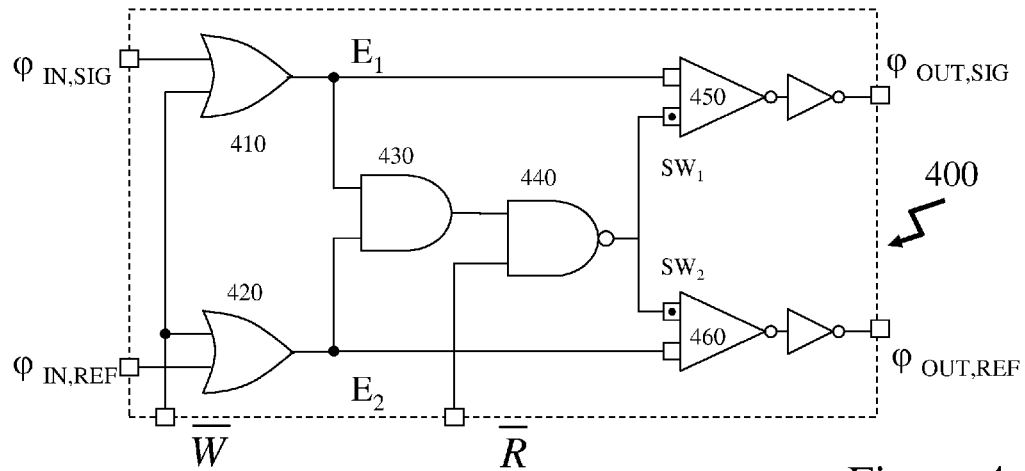
FIG. 4 depicts a circuit diagram for a Time-Latch according to an embodiment of the invention employing a Switched Delay Unit according to an embodiment of the invention.

Time-Latch:

Within conventional digital electronics a flip-flop or latch refers to a circuit that has two stable states that can be used to store state information, and can be made to change state by signals applied to one or more control inputs and will have one or two outputs. Such flip-flops (latches) form the basic storage element in sequential digital logic. Accordingly, the inventors have established a time-latch (TLatch), a time memory element, based upon combining SDU devices, with the discharge interruption in the delay unit, together with additional digital circuitry. A circuit schematic of such a TLatch 400 is depicted in FIG. 4 according to an embodiment of the invention. TLatch 400 operates in three phases of "Write", "Idle", and "Read" which are controlled by a write signal W and a read signal R. During the "Write" phase, W=0 and R=1, the input stage of the TLATCH 400 comprising first and second (i.e. W="O" and R="1") the input stage is enabled to feed signals $\phi_{IN,SIG}$ and $\phi_{IN,REF}$ into the block through the first and second input OR gates 410 and 420 respectively.

As such with the occurrence of the input rising edges at $\phi_{IN,SIG}$ and $\phi_{IN,REF}$, the phase difference between these input signals, i.e. $\Delta T_{IN}$, is stored as the difference between the charges captured on the capacitors inside the first and second SDUs 450 and 460 which are coupled to the first and second OR gates 410 and 420 respectively. After latching the input TM variable into the TLatch 400 the circuit enters the "idle" phase, W=1 and R=1, and the charges stored upon the capacitors within first and second SDUs 450 and 460 respectively will be preserved will be preserved until the "Read" phase is initiated. During the "Read" phase the R signal coupled to NAND 440 changes to "0" resulting in rising edges at the outputs of first and second SDUs 450 and 460 and accordingly $\phi_{OUT,SIG}$ and $\phi_{OUT,REF}$ respectively of TLatch 400, with the same time difference as the input signals $\phi_{IN,SIG}$ and $\phi_{IN,REF}$ coupled to the input of TLatch 400.

Figure 5:
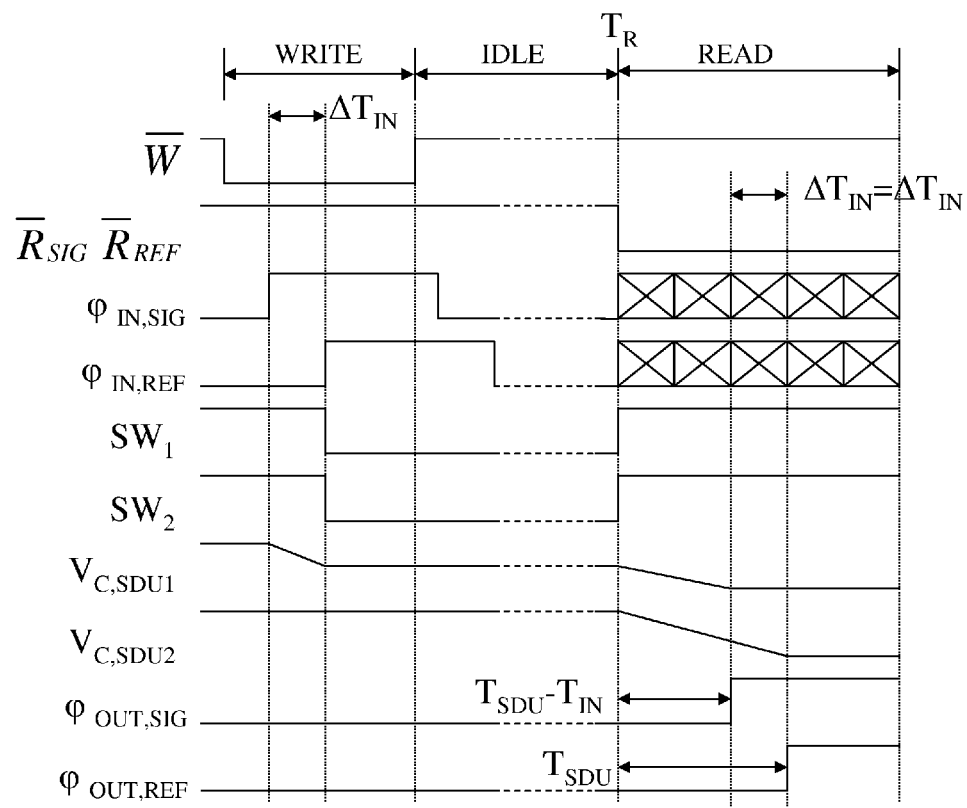
FIG. 5 depicts the operational signals of the Time Latch according to an embodiment of the invention described in FIG. 4.

Now referring to FIG. 5 to illustrate how a TLatch such as TLatch 400 operates, the operational signals during "Write" and "Read" phases of operation are depicted. Beginning with the "Write" phase, and before the occurrence of the input rising edges, namely when $\phi_{IN,SIG}=\phi_{IN,REF}=$"0", the low logic level at the input to each of the first and second SDUs 450 and 460 respectively pre-charges the capacitors inside each SDU to $V_{DD}$ and, at the same time, forces a logic level of 1 at the SW inputs, $SW_1$ and $SW_2$, to each of the first and second SDUs 450 and 460 respectively. This enables each of the first and second SDUs 450 and 460 respectively to discharge towards the ground node when needed. In the case that the input edge associated with $\phi_{IN,SIG}$ arrives before the corresponding edge of $\phi_{IN,REF}$, the pre-charged capacitor inside of the first SDU 450 starts to discharge while the internal capacitor of the second SDU 460 remains unchanged at its pre-charged level. When the rising edge of $\phi_{IN,REF}$ occurs, i.e. $\phi_{IN,SIG}=\phi_{IN,REF}=$"1", the $SW_1$ and $SW_2$ signals to the first and second SDUs 450 and 460 respectively become "0" as a result of the effect of AND 430 thereby holding the charge state of each of the first and second SDUs 450 and 460, as no direct discharge path is available. After latching the input time difference, and changing the W signal to logic "1", the TLatch 400 enters its "Idle" state and the charge stored in each capacitor of the first and second SDUs 450 and 460 respectively will no longer be affected by the input signals.

During the "Read" phase, R is set to "0" at time $T_R$ which forces the $SW_1$ and $SW_2$ signals to the first and second SDUs 450 and 460 respectively become logic level "1". This change in turn causes each capacitor of the first and second SDUs 450 and 460 respectively to begin to discharge towards ground at the same rate. From an initial pre-charged state, an SDU takes $T_{SDU}$ seconds to discharge before its output changes state (i.e. $\phi_{OUT}$ set to logic 1 level). In the case of the second SDU 460, since the discharge has not yet begun, the delay unit needs $T_{SDU}$ seconds to deliver its output at $T_{OUT,REF}$ as given by Equation (2). In the case of the first SDU 450, however, the capacitor has already been discharged for $\Delta T_{IN}$ seconds and accordingly the output will be delivered earlier as given by Equation (3).

$$T_{OUT,REF}=T_R+T_{SDU} \quad (2)$$

$$T_{OUT,SIG}=T_R+T_{SDU}-\Delta T_{IN} \quad (3)$$

As the difference between the outputs of the first and second SDUs 450 and 460 is $\Delta T_{IN}$ then it is evident that the TM variable latched during the "Write" phase has been restored at the output during the "Read" phase. As the output of the first SDU 450 is provided in $T_{SDU}-\Delta T_{IN}$ seconds it would be evident that the maximum input phase difference supported by the TLatch 400 $T_{SDU}$ in order to allow for a positive discharge time after applying the read signal, R.

Addition and Subtraction:

As evident from the preceding discussion and presentation of TMSP processes the requirements for the addition and subtraction of two separate time-differences is central to most TMSP algorithms. TLatch 400 as discussed supra in respect of FIGS. 4 and 5 provides for a time memory element of TMSP solutions. However, with processes such as addition and subtraction it would be evident that issues arise from the fact reach TM variable is represented by a set of edges, namely the reference and signal rising edges in the two-signal representation and the rising/falling edges in the one-signal representation. As such to add or subtract two TM variables at a processing node within a TMSP circuit then the pair of sets of edges should be synchronized with respect to one another. However, in most circuit implementations some asynchronization, i.e. reference signal timing or phase difference, between any two sets of edges to be added or subtracted may be expected. Even for matched routing between two TLatches to the addition/subtraction node variations in manufacturing of the devices may lead to imbalanced triggering of outputs etc. As such this synchronization issue presents a significant problem for performing arithmetic operations on TM variables. Accordingly, the inventors have extended the concepts within the TLatch 400 to provide for circuits such as depicted in respect of FIGS. 6A and 6B below.

Figure 6A:
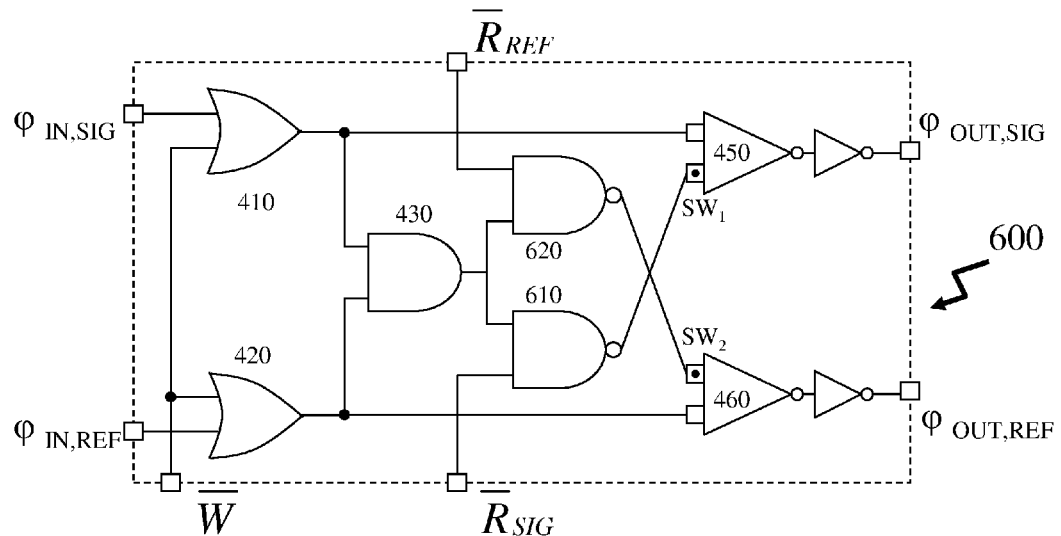
FIGS. 6A and 6B depict circuit diagrams for Time-Latches according to an embodiment of the invention with differential read signals employing a Switched Delay Unit according to an embodiment of the invention.

Referring initially to FIG. 6A a new TLatch configuration, referred to within this specification as a Summation-Subtraction TLatch (SS-TLatch) 600, is depicted wherein a pair of read signals, $R_{SIG}$ and $R_{REF}$, are coupled to first and second NAND gates 610 and 620 respectively. Accordingly, first and second NAND gates 610 and 620 respectively generate separately the SW inputs, $SW_1$ and $SW_2$, to each of the first and second SDUs 450 and 460 respectively. Accordingly the pair of R signals are introduced at different times, $T_{R,REF}$ and $T_{R,SIG}$, such that $\Delta T_R$ is determined by Equation (4).

$$\Delta T_R = T_{R,REF} - T_{R,SIG} \qquad (4)$$

Rewriting the expressions for each of the first and second SDUs 450 and 460 respectively as given previously in Equations (2) and (3) using the appropriate R signal, then time difference at the output of the SS-TLatch 600 changes to that given by Equation (5).

$$\Delta T_{OUT} = \Delta T_{IN} + \Delta T_R \qquad (5)$$

Figure 6B:
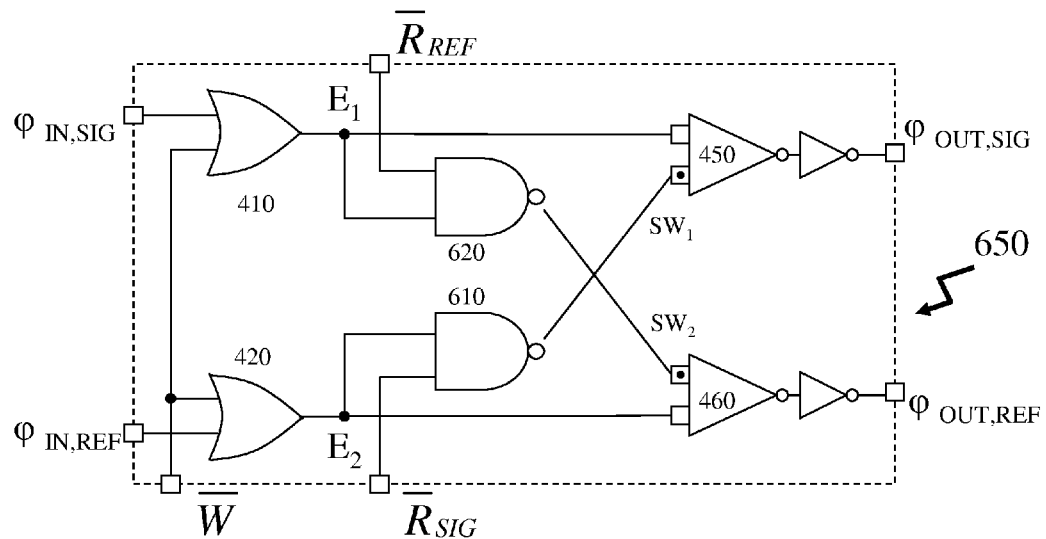

Referring to FIG. 6B a variant of SS-TLatch 650 is presented wherein the AND gate 430 within the TLatch 400 memory element and SS-TLatch 600 summation-subtraction element is removed and the outputs of first and second OR gates 410 and 420 respectively are coupled to the second and first NAND gates 620 and 610 respectively.

It is evident from the description supra in respect of SS-TLatch 600 that the time (phase) difference at the output of the SS-TLatch 600 is the summation of two sets of independent time-differences. As a consequence, a SS-TLatch 600 or SS-TLatch 650, can be employed to add together two signals $\Delta T_{IN1}$ and $\Delta T_{IN2}$. After initially latching $\Delta T_{IN1}$ at the input, the SS-TLatch 600 awaits the arrival of $\Delta T_{IN2}$ at the R signal ports as the second input to evaluate the summation of these two TM variables. Such a configuration is shown in FIG. 7A wherein the second signal set, comprising the $\phi_{IN2,SIG}$ and $\phi_{IN2,REF}$ signals, is coupled to the $R_{SIG}$ and $R_{REF}$ inputs respectively of the SS-TLatch 600 and the first signal set, comprising the $\phi_{IN1,SIG}$ and $\phi_{IN1,REF}$ signals, is coupled to the input ports of the SS-TLatch 600. By interchanging the connections for signals $R_{SIG}$ and $R_{REF}$ within the SS-TLatch 600 such that they now receive the $\phi_{IN1,REG}$ and $\phi_{IN1,SIG}$ signals, as depicted in FIG. 7B, then the time difference between the R signals changes to $-\Delta T_{IN2}$ such that the output of the SS-TLatch 600 is given by Equation (6), namely the subtraction of two TM variables.

$$\Delta T_{OUT} = \Delta T_{IN1} + (-\Delta T_{IN2}) \qquad (6)$$

Simulation Results:

The TLatch 400 depicted in FIG. 4 was simulated in software from Cadence Design Systems using the BSIM3v3 models of the 1.2V 0.13 μm CMOS technology employed by IBM. Accordingly, the $T_{SDU}$ of the simulated SDU inside the TLatch 400 was measured to be 86.6 ns. The TLatch 400 was then simulated for the capture the time (phase) difference, $\Delta T$, of two digital signals applied to its input over the range $-84$ ns $\leq \Delta T \leq 84$ ns. As evident from FIG. 8 these simulations show that the difference of the stored TM variable and the input TM variable had a peak absolute value was below 22 ps over the range $-84$ ns $\leq \Delta T \leq 84$ ns. Also evident from these simulations these errors are higher when the difference is close to zero, and that for $|\Delta T| \geq 15$ ns the error is less than 10 ps. Analysis of the circuit models showed that the nonlinear error was caused by variation in the differential leakage currents resulting from the differences in the charge stored within each SDU.

Subsequently, the summation-subtraction function of the SS-TLatch was investigated with Spectre Circuit Simulator, a SPICE-class circuit simulator for analog integrated circuits. Specifically, the SS-TLATCH 600 as depicted in FIG. 6A and discussed supra in respect of addition configuration of the SS-TLatch in FIG. 7A was evaluated with an input time difference, $\phi_{IN1}$, of $-84$ ns $\leq \phi_{IN1} \leq 84$ ns, together with the time difference on the second input, $\phi_{IN2}$, of 0 ns $\leq \phi_{IN1} \leq 500$ ns. Based upon these simulations no extra error was evident to that established in simulations of the SDU 400 discussed supra. A similar series of simulations were performed on the subtraction configuration of the SS-TLatch in FIG. 7B and the results were similar to those found for the addition configuration.

Accordingly, it would be evident that the TM variable processing Switched Delay Unit, such as depicted in respect of embodiments of the invention described supra in respect of FIGS. 3A and 3C and other embodiments not explicitly depicted, may therefore form the basis of TLatch TM variable memory elements, such as the SS-TLatches depicted in respect of FIGS. 6A and 6B supra, for summation-subtraction TM variable elements. As discussed in respect of these embodiments of the invention the rising edges of two signals are employed through switched-delay units and time latch blocks such that the phase difference between two rising edges can be easily latched and stored for future use as well as for performing summation and subtraction processes. It would be evident to one skilled in the art that other more advanced signal processing algorithms can be implemented based upon the functions of delay, latched storage, summation and subtraction.

It would be evident that alternate embodiments of the invention may be designed to exploit single signal representations. For example, considering SDU 300 the arrival of a rising edge at $\phi_{IN}$ with SW="1" results in the voltage across Capacitor 360 beginning to discharge through transistors $M_2$ 320 to $M_4$ 340. The switching off of M4 before the inverter is triggered results in the discharge procedure stopping and the residual charge stored within the Capacitor 360. Accordingly, if the single signal is coupled to both the $\phi_{IN}$ and SW, with $\phi_{IN}$ delayed relative to SW, then rising edge will begin the discharge process as the rising edge at $\phi_{IN}$ with SW="1" condition is met and the discharge process will stop when the falling edge results in SW="0". Accordingly, single signal variants of the SDU, TL-Latch, and SS-TLatch may also be implemented.

Further it would be evident that these circuits may receive their TM variable data as the result of other circuits such as digital-to-time converters (DTCs) for example which may be implemented using a variety of techniques including, but not limited to, so-called "pulse modulation" converters wherein the location of a pulse represents the digital input, delay-locked loops (DLLs), edge placements circuits exploiting DLL/MUX, and multi-level $\Sigma\Delta$ modulation fed DTC. Similarly, these circuits may provide their TM variable data to time-to-digital converters (TDCs) such as those based upon a variety of techniques including, but not limited to, counter-based TDCs, flash ADC TDC, Vernier delay line flash TDC, and DLL flash TDC, so-called component invariant TDCs, and time-to-voltage ADCs. Other TM circuits may include phase-locked loops, Infinite Impulse Response (IIR) filters, and ADCs for example wherein these and various DTCs/TDCs may exploit programmable time delay elements such as SDUs according to embodiments of the invention described supra in respect of FIG. 3A to FIG. 8 for example.

Figure 9:
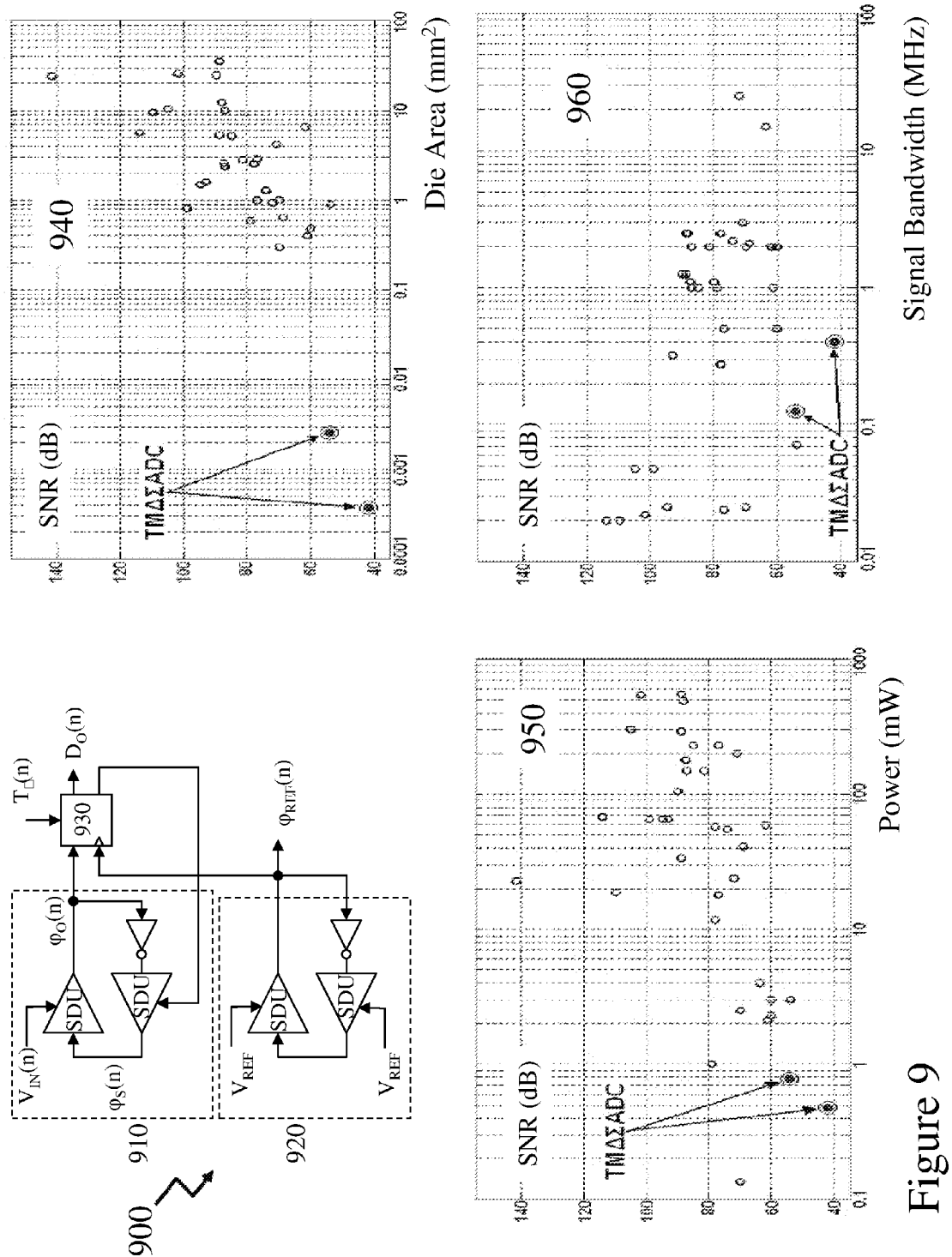
FIG. 9 depicts comparisons of Time-Mode SD Analog-to-Digital Converters against prior art voltage mode circuits for die area, power, and signal bandwidth.

In many instances these circuits may be significantly smaller with lower power consumption. Referring to FIG. 9 there is depicted a TM first-order $\Sigma\Lambda$ ADC 900 comprising DLL 910 with a pair of SDU circuits and D Latch 930 in conjunction with analog time reference circuit 920. Accordingly the output of D Latch 930 is given by Equation (7). Referring to first to third graphs 940 to 960 respectively the performance of TM first-order ΣΛ ADCs, such as first-order ΣΛ ADC 900, is compared with conventional ADCs. As evident the die footprint is approximately 2 orders of magnitude lower whilst the power consumption is amongst the best reported. However, signal bandwidth and signal-to-noise ratio (SNR) are towards the low end but are being compared to well established digital voltage based designs and accordingly it would be expected that with development the performance of TM first-order ΣΛ ADCs would improve and be comparable to that of conventional designs, and potentially superior as the extremely small footprint allows for compensation and control circuits to be added and still maintain a large footprint differential.

$$D_O(n) = V_{IN}(n-1) + \frac{1}{G_\phi}[T_\varepsilon(n) - T_\varepsilon(n-1)] \quad (7)$$

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A time mode device comprising:
   a switchable delay unit comprising:
   a first input port for receiving a signal comprising at least a first rising edge;
   a second input port for receiving a switch signal comprising at least a first falling edge and a second rising edge;
   a first circuit portion for receiving the signal and charging a capacitor from a predetermined supply voltage when the signal is low and discharging the capacitor when the signal is high;
   a second circuit portion for selectively coupling the capacitor to ground to enable its discharge when the switch signal is high and disable the discharge when the signal is high;
   an inverter circuit coupled to the capacitor, the inverter having a predetermined threshold voltage;
   wherein receipt of the second rising edge by the second circuit portion results in the voltage on the capacitor dropping below the predetermined threshold such that the inverter generates an output rising edge having a time delay with respect to the first rising edge; and
   the signal is coupled to the first input port in dependence upon a write signal applied to a first gate;
   the first falling edge of the switch signal is generated in dependence upon at least a receipt of a rising edge of a reference signal; and
   the second rising edge of the switch signal is generated in dependent upon at least a receipt of a read signal.

2. The time mode device according to claim 1, wherein the time delay comprises:
   a first predetermined portion established in dependence upon the capacitance of the capacitor and a bias voltage applied to the second circuit portion; and
   a second portion equal to the time difference between the first falling edge and second rising edge of the switch signal.

3. The time mode device according to claim 1, wherein the switch signal is generated by a third portion of the time mode device receiving at least the reference signal and read signal.

4. The time mode device according to claim 1, further comprising;
   a second switchable delay unit; and
   a third portion of the time mode device for generating the switch signal to the first switchable delay unit and the switch signal to the second switchable delay unit, the third portion of the time mode device receiving the signal coupled to the first input port of the switchable delay unit, the signal coupled to a first input port of the second switchable delay unit, and at least a first read signal.

5. The time mode device according to claim 4, wherein the third portion of the time mode device generates the falling edge of the switch signal in dependence upon the signal coupled to the first input port of the switchable delay unit being at a predetermined level, the signal coupled to the first input port of the second switchable delay unit having an edge, and the read signal being at a predetermined level; and
   the third portion of the time mode device generates the rising edge of the switch signal in dependence upon receipt of at least an edge of the read signal.

6. The time mode device according to claim 4, wherein the signal coupled to the first input port of the switchable delay unit and the signal coupled to the first input port of the second switchable delay unit are coupled in dependence upon a write signal to a fourth predetermined portion of the time mode device.

7. The time mode device according to claim 6, wherein the time mode device provides for at least one of the addition and subtraction of a control time delay from an input time delay, wherein
the input time delay is that between corresponding edges of the two signals coupled to the first and second switchable delay units,
the control time delay is the time delay between corresponding edges of the write signal and the read signal, and
the time mode adds when the edge of the write signal precedes the read signal and subtracts when the edge of the read signal precedes the write signal.

8. The time mode device according to claim 6, wherein a third portion of the time mode device receives a second read signal in addition to the first read signal and generates the switch signal for the first switchable delay unit in dependence upon at least the first read signal and generates the switch signal to the second switchable delay unit in dependence upon at least the second read signal.

9. The time mode device according to claim 6, wherein the time mode device provides a switchable delay unit for an input time delay, the input time delay being that between corresponding edges of the two signals coupled to the first and second switchable delay units and representative of a value of a time mode variable; and
the time mode device generates two output signals in dependence upon the read signal wherein an output time delay applied to corresponding edges of the two output signals is established in dependence upon the input time delay.

10. The time mode device according to claim 4, wherein the time mode device provides a switchable delay unit for an input time delay, the input time delay being that between corresponding edges of the two signals coupled to the first and second switchable delay units and representative of a value of a time mode variable; and
the time mode device generates two output signals in dependence upon the read signal wherein an output time delay applied to corresponding edges of the two output signals is established in dependence upon the input time delay.

11. The time mode device according to claim 1, further comprising;
a second switchable delay unit;
a third portion of the time mode device for generating the switch signal to the first switchable delay unit and the switch signal to the first switchable delay unit, the third portion of the time mode device receiving the signal coupled to the first input port of the switchable delay unit, the signal coupled to a first input port of the second switchable delay unit, and at least a first read signal; and
a fourth portion of the time mode device for selectively coupling the signals to the first input ports of the first and second switchable delay units in dependence upon a write signal applied to the fourth portion of the time mode device.

12. A time-mode device comprising:
first and second switchable delay units, each switchable delay unit comprising:
first and second input ports, each input port for receiving a signal comprising at least a rising edge and a falling edge;
a first circuit portion for charging a capacitor from a predetermined supply voltage when the signals on the first and second input ports have first predetermined level combination and discharging the capacitor when the signals on the first and second input ports have second predetermined level combination; and
a second circuit portion for selectively coupling and decoupling the capacitor to ground to enable and disable respectively its discharge when at least the signal on the first input port is high and when at least the signal on the second input port is high respectively; and
a signal generator circuit for generating a switch signal to the first switchable delay unit and the switch signal to the second switchable delay unit, the signal generator circuit receiving the signal coupled to the first input port of the first switchable delay unit, the signal coupled to the first input port of the second switchable delay unit, and at least a first read signal and generating the switch signals to replace the signals received at the first input ports.

13. The time-mode device according to claim 12, wherein an output edge of a signal from each switchable delay unit within the time-mode device is generated in dependence upon a voltage on the capacitor and a predetermined threshold voltage has a predetermined time delay with respect to an edge of the signal received at the first input signal wherein,
the predetermined time delay comprises a first predetermined portion established in dependence upon the capacitance of the capacitor and a bias voltage applied to the second circuit portion and a second portion equal to the time difference between a first edge and a second opposite edge of the signal received at the second input port.

14. The time-mode device according to claim 13, wherein the time mode device generates two output signals in dependence upon the read signal wherein an output time delay applied to corresponding edges of the two output signals is established in dependence upon the input time delay, the input time delay being that between corresponding edges of the two signals coupled to the first input ports of the first and second switchable delay units.

15. The time-mode device according to claim 13 further comprising;
a write circuit for selectively coupling two signals received at the time-mode device to the first input ports of the first and second switchable delay units in dependence upon a write signal applied to the write circuit.

16. The time-mode device according to claim 15, wherein the time mode device provides for at least one of the addition and subtraction of a control time delay from an input time delay, the time mode adding when the edge of the write signal precedes the read signal and subtracting when the edge of the read signal precedes the write signal where the input time delay is that between corresponding edges of the two signals coupled to the first and second switchable delay units by the write circuit and the control time delay is the time delay between corresponding edges of the write signal and the read signal.

17. A time mode device comprising:
a switchable delay unit comprising:
a first input port for receiving a signal comprising at least a first rising edge;
a second input port for receiving a switch signal comprising at least a first falling edge and a second rising edge;

a first circuit portion for receiving the signal and charging a capacitor from a predetermined supply voltage when the signal is low and discharging the capacitor when the signal is high;
a second circuit portion for selectively coupling the capacitor to ground to enable its discharge when the switch signal is high and disable the discharge when the signal is high;
an inverter circuit coupled to the capacitor, the inverter having a predetermined threshold voltage;
wherein receipt of the second rising edge by the second circuit portion results in the voltage on the capacitor dropping below the predetermined threshold such that the inverter generates an output rising edge having a time delay with respect to the first rising edge;
a second switchable delay unit; and
a third portion of the time mode device for generating the switch signal to the first switchable delay unit and the switch signal to the second switchable delay unit, the third portion of the time mode device receiving the signal coupled to the first input port of the switchable delay unit, the signal coupled to a first input port of the second switchable delay unit, and at least a first read signal.

18. A time mode device according to claim 17, further comprising;
a fourth portion of the time mode device for selectively coupling the signals to the first input ports of the first and second switchable delay units in dependence upon a write signal applied to the fourth portion of the time mode device.

19. A time mode device according to claim 17, wherein the time delay comprises:
a first predetermined portion established in dependence upon the capacitance of the capacitor and a bias voltage applied to the second circuit portion; and
a second portion equal to the time difference between the first falling edge and second rising edge of the switch signal.

* * * * *